(12) United States Patent
Yang et al.

(10) Patent No.: US 9,935,294 B2
(45) Date of Patent: Apr. 3, 2018

(54) DISPLAY DEVICE HAVING REFLECTION TRANSMISSION LAYER AND REFLECTIVE LAYER

(71) Applicants: BOE TECHNOLOGY GROUP CO., LTD., Beijing (CN); HEFEI XINSHENG OPTOELECTRONICS TECHNOLOGY CO., LTD., Hefei (CN)

(72) Inventors: Yuting Yang, Beijing (CN); Chun Ye, Beijing (CN); Kun Li, Beijing (CN); Shancai Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 0 days.

(21) Appl. No.: 15/210,140

(22) Filed: Jul. 14, 2016

(65) Prior Publication Data

US 2017/0207420 A1    Jul. 20, 2017

(30) Foreign Application Priority Data

Jan. 19, 2016 (CN) .......................... 2016 1 0034971

(51) Int. Cl.
*H01L 33/40* (2010.01)
*H01L 51/50* (2006.01)
(Continued)

(52) U.S. Cl.
CPC ........ *H01L 51/5271* (2013.01); *H01L 51/504* (2013.01); *H01L 51/56* (2013.01);
(Continued)

(58) Field of Classification Search
CPC ... H01L 33/405; H01L 33/60; H01L 51/5218; H01L 51/5271
See application file for complete search history.

(56) References Cited

U.S. PATENT DOCUMENTS 5,965,907 A    10/1999 Huang et al.
2005/0067954 A1    3/2005 Nishikawa et al.
(Continued)

FOREIGN PATENT DOCUMENTS

CN    1604703    4/2005
CN    1674752    9/2005
(Continued)

OTHER PUBLICATIONS

Office Action from corresponding Chinese Application No. 201610034971.7 dated Dec. 20, 2017 (6 pages).

*Primary Examiner* — Hoai V Pham
(74) *Attorney, Agent, or Firm* — Harness, Dickey & Pierce, P.L.C.

(57) ABSTRACT

The present disclosure relates to a display substrate, a fabricating method thereof, and a display device, which belong to the field of display technology. The display substrate comprises: a base substrate, and a first light emitting unit disposed on the base substrate, the first light emitting unit comprising: a first selective reflection transmission layer, an anode layer, a first organic light emitting layer, a cathode layer and a reflective layer, superposed sequentially, wherein the first selective reflection transmission layer and the reflective layer are capable of reflecting color light emitted from the first organic light emitting layer, so that the color light oscillates between the first selective reflection transmission layer and the reflective layer, and exits the base substrate via the first selective reflection transmission layer. The embodiments described herein can (Continued)

improve the light outgoing efficiency of the display substrate and the display device made of the display substrate.

20 Claims, 11 Drawing Sheets

(51) Int. Cl.
  *H01L 51/52* (2006.01)
  *H01L 51/56* (2006.01)
  *H01L 51/00* (2006.01)

(52) U.S. Cl.
  CPC .......... *H01L 51/005* (2013.01); *H01L 51/007* (2013.01); *H01L 51/0056* (2013.01); *H01L 51/0058* (2013.01); *H01L 51/0065* (2013.01); *H01L 51/0067* (2013.01); *H01L 51/0072* (2013.01); *H01L 51/0073* (2013.01); *H01L 2051/0063* (2013.01)

(56) References Cited

U.S. PATENT DOCUMENTS

| 2005/0212407 | A1  | 9/2005 | Matsusue |
|---|---|---|---|
| 2008/0007155 | A1* | 1/2008 | Adachi ................ G02B 5/3016 313/498 |
| 2008/0038584 | A1  | 2/2008 | Akai |

FOREIGN PATENT DOCUMENTS

| CN | 101123838 | 2/2008 |
|---|---|---|
| CN | 2010033153 | 3/2010 |
| CN | 102171849 | 8/2011 |

\* cited by examiner forming a first light emitting unit on a base substrate; and the forming a first light emitting unit on a base substrate comprising: sequentially forming, on the base substrate, a first selective reflection transmission layer, an anode layer, a first organic light emitting layer, a cathode layer, and a reflective layer. ⟋301

US 9,935,294 B2

DISPLAY DEVICE HAVING REFLECTION TRANSMISSION LAYER AND REFLECTIVE LAYER

CROSS-REFERENCE TO RELATED APPLICATION

This application claims the benefit and priority of Chinese Patent Application No. 201610034971.7 filed Jan. 19, 2016. The entire disclosure of the above application is incorporated herein by reference.

FIELD

The present disclosure relates to the field of display technology, and particularly, to a display substrate, a fabricating method thereof, and a display device.

BACKGROUND

This section provides background information related to the present disclosure which is not necessarily prior art.

Organic Light-Emitting Diode (OLED) display device is a display device having self-luminous function. Because it needs no backlight source and has advantages like high contrast, small thickness, wide viewing angle, fast response, high-low temperature resistance, etc., it has a broad prospect in the display industry.

An OLED display device typically may include a display substrate, which comprises a base substrate, and three light emitting units superposed sequentially on the substrate. By way of example, the three light emitting units comprise: a red light unit, a green light unit and a blue light unit, each light emitting unit including: a cathode layer, an organic light emitting layer and an anode layer superposed sequentially. The base substrate is typically a glass substrate; the cathode layer is usually a metal film layer or Indium Tin Oxides (ITO) transparent conductive film layer; the anode layer is usually an ITO transparent conductive film layer; and the organic light emitting layer is an OLED light emitting layer.

Since the refractivity of the anode layer and of the organic light emitting layer is greater than the refractivity of the base substrate and the refractivity of the base substrate is greater than the refractivity of air, light emitted from the organic light emitting layer easily take place total reflection at the interface between the anode layer and the base substrate and the interface between the base substrate and the air, not easily exits the base substrate, whereby the display substrate and the display device comprising the display substrate have a low light outgoing efficiency.

SUMMARY

This section provides a general summary of the disclosure, and is not a comprehensive disclosure of its full scope or all of its features.

The present disclosure provides a display substrate, a fabricating method thereof, and a display device, which can improve light outgoing efficiency of the display substrate and of the display device including the display substrate.

In a first aspect of embodiments described herein, there is provided a display substrate comprising: a base substrate, and a first light emitting unit disposed on the base substrate, the first light emitting unit comprising: a first selective reflection transmission layer, an anode layer, a first organic light emitting layer, a cathode layer and a reflective layer, superposed sequentially, wherein the first selective reflection transmission layer and the reflective layer are capable of reflecting color light emitted from the first organic light emitting layer, so that the color light oscillates between the first selective reflection transmission layer and the reflective layer, and exits the base substrate via the first selective reflection transmission layer.

In one example, the display substrate further comprises a plurality of second light emitting units between the first light emitting unit and the base substrate, the second light emitting unit comprising: two second selective reflection transmission layers, and an anode layer, a second organic light emitting layer and a cathode layer superposed sequentially between the two second selective reflection transmission layers, wherein the two second selective reflection transmission layers are capable of reflecting color light emitted from the second organic light emitting layer, so that the color light oscillates between the two second selective reflection transmission layers, and exits the base substrate via the second selective reflection transmission layer of the second light emitting unit close to the base substrate.

In one example, the number of the second light emitting unit is two, the two said second light emitting units are sequentially superposed between the first light emitting unit and the base substrate, and optical characteristics of the second selective reflection transmission layers of the two said second light emitting units are different.

In one example, the organic light emitting layers of light emitting units among the first light emitting unit and the two said second light emitting units are configured to emit light with different color, and the organic light emitting layer of each light emitting unit is configured to emit light with one color.

In one example, the reflective layer has reflectivity greater than 60% for light emitted from the organic light emitting layer of each light emitting unit among the first light emitting unit and the two said second light emitting units;

the selective reflection transmission layer of any one light emitting unit among the first light emitting unit and the two said second light emitting units has reflectivity greater than 60% for light emitted from the organic light emitting layer of the any one light emitting unit, and has transmittivity greater than 60% for light emitted from the organic light emitting layer of other light emitting units.

In one example, the first light emitting unit includes any one of a red light unit, a green light unit and a blue light unit; each of the two said second light emitting units includes any one of a red light unit, a green light unit, and a blue light unit.

In one example, the first light emitting unit being a red light unit, and the two said second light emitting units being a green light unit and a blue light unit, respectively.

In one example, the material forming the organic light emitting layer of the red light unit comprises: rhodamine dye, 4-Dicyanomethylene-2-methyl-6-(4-dioctylaminostyryl)-4H-pyran or 2-[2-(1-Methylethyl)-6-[2-(2,3,6,7-tetrahydro-1,1,7,7-tetramethyl-1H,5H-benzo[ij]quinolizin-9-yl)ethenyl]-4H-pyran-4-ylidene]propanedinitrile;

the material forming the organic light emitting layer of the green light unit comprises: coumarin fluorescent dye, quinacridone, coronene, or aniline fluorescent dye;

and the material forming the organic light emitting layer of the blue light unit comprises: N-aromatic benzimidazole fluorescent dye, 1,2,4-triazole derivative fluorescent dye, 1,3,4-oxadiazole derivative fluorescence dye or distyrylarylene derivative material.

In a second aspect of the embodiments described herein, there is provided a method of fabricating a display substrate comprising:

forming a first light emitting unit on a base substrate;

the forming a first light emitting unit on a base substrate comprising: sequentially forming, on the base substrate, a first selective reflection transmission layer, an anode layer, a first organic light emitting layer, a cathode layer, and a reflective layer;

wherein the first selective reflection transmission layer and the reflective layer are capable of reflecting color light emitted from the first organic light emitting layer, so that the color light oscillates between the first selective reflection transmission layer and the reflective layer, and exits the base substrate via the first selective reflection transmission layer.

In one example, before the forming a first light emitting unit on a base substrate, the method further comprises:

forming a plurality of second light emitting units on the base substrate, respectively, each second light emitting unit comprising: an anode layer, a second organic light emitting layer, a cathode layer, and two second selective reflection transmission layers, wherein, a method for forming each second light emitting unit comprising: sequentially forming, on the base substrate, one second selective reflection transmission layer of the two second selective reflection transmission layers, the anode layer, the second organic light emitting layer, the cathode layer, and the other second selective reflection transmission layer of the two second selective reflection transmission layers, wherein the second light emitting units are located between the base substrate and the first light emitting unit, and the two second selective reflection transmission layers are capable of reflecting color light emitted from the second organic light emitting layer, so that the color light oscillates between the two second selective reflection transmission layers, and exits the base substrate via the second selective reflection transmission layer of the second light emitting units close to the base substrate.

In one example, the number of the second light emitting units is two, the two said second light emitting units are sequentially superposed between the first light emitting unit and the base substrate, and optical characteristics of the second selective reflection transmission layers of the two said second light emitting units are different.

In one example, the organic light emitting layers of light emitting units among the first light emitting unit and the two said second light emitting units are configured to emit light with different color, and the organic light emitting layer of each light emitting unit is configured to emit light with one color.

In one example, the reflective layer has reflectivity greater than 60% for light emitted from the organic light emitting layer of each light emitting unit among the first light emitting unit and the two said second light emitting units;

the selective reflection transmission layer of any one light emitting unit among the first light emitting unit and the two said second light emitting units has reflectivity greater than 60% for light emitted from the organic light emitting layer of the any one light emitting unit, and has transmittivity greater than 60% for light emitted from the organic light emitting layer of other light emitting units.

In a third aspect of the embodiments described herein, there is provided a display device, the display device comprising a display substrate according to the first aspect.

In the display substrate, the fabricating method thereof and the display device provided in the embodiments described herein, the first organic light emitting layer can emit color light under the action of the anode layer and the cathode layer, and the first organic light emitting layer and the reflective layer are capable of reflecting color light, so that the color light oscillates between the first selective reflection transmission layer and the reflective layer, and exits the base substrate via the first selective reflection transmission layer. Since, when the color light oscillates between the first selective reflection transmission layer and the reflective layer, the outgoing direction of light can be adjusted so that the outgoing direction of light is perpendicular to a light outgoing surface of the display substrate, the occurrence of total reflection of light is avoided, improving the light outgoing efficiency of the display substrate.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Throughout the various views in the drawings, corresponding reference signs indicate corresponding parts or features.

Corresponding reference numerals indicate corresponding parts or features throughout the several views of the drawings.

DETAILED DESCRIPTION

Example embodiments will now be described more fully with reference to the accompanying drawings.

Figure 1:
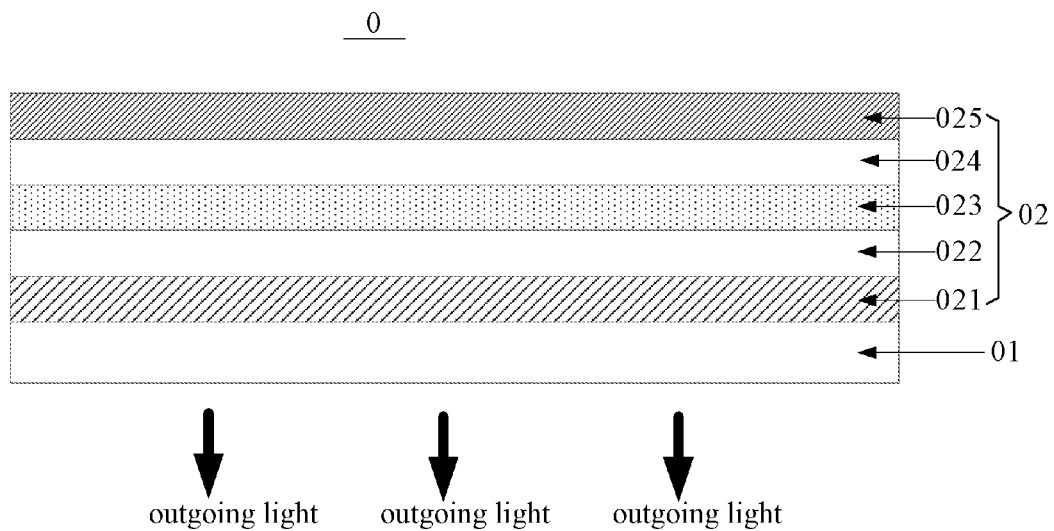
FIG. 1 is an schematic structural diagram of a display substrate according to an embodiment of the present disclosure.

FIG. 1 shows a schematic structural diagram of a display substrate 0 according to an embodiment of the present disclosure. Referring to FIG. 1, the display substrate 0 may include a base substrate 01, and a first light emitting unit substrate 02 disposed on the base substrate 01.

The base substrate 01 may be a transparent substrate, which may specifically be a substrate made of a light conductive and non-metallic material having a certain robustness, such as glass, quartz, transparent resin.

The base substrate 01 is provided with a first light emitting unit 02, the first light emitting unit 02 comprising: a first selective reflection transmission layer 021, an anode layer 022, a first organic light emitting layer 023, a cathode layer 024 and a reflective layer 025, superposed sequentially.

In the present embodiment, the first organic light emitting layer 023 can emit color light under the action of the anode layer 022 and the cathode layer 024. The first selective reflection transmission layer 021 and the reflective layer 025 are capable of reflecting color light emitted from the first organic light emitting layer, so that the color light oscillates between the first selective reflection transmission layer 021 and the reflective layer 015, and exits the base substrate 01 via the first selective reflection transmission layer 021.

As described above, the display substrate provided in the present embodiment comprises a base substrate, on which the base substrate there is provided a first light emitting unit, the first light emitting unit comprising: a first selective reflection transmission layer, an anode layer, a first organic light emitting layer, a cathode layer and a reflective layer, superposed sequentially. The first organic light emitting layer can emit color light under the action of the anode layer and the cathode layer, and the first selective reflection transmission layer and the reflective layer are capable of reflecting color light, so that the color light oscillates between the first selective reflection transmission layer and the reflective layer, and exits the base substrate via the first selective reflection transmission layer. Since, when the color light oscillates between the first selective reflection transmission layer and the reflective layer, the outgoing direction of light can be adjusted so that the outgoing direction of light is perpendicular to a light outgoing surface of the display substrate, avoiding the total reflection of light, and thus improving the light outgoing efficiency of the display substrate.

Figure 2A:
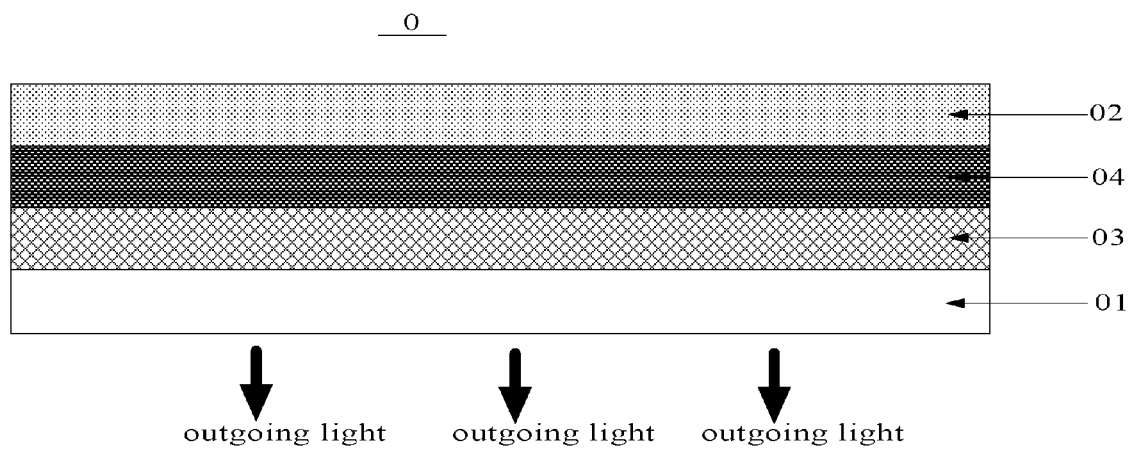
FIG. 2A is an schematic structural diagram of a display substrate according to another embodiment of the present disclosure.

FIG. 2A shows a schematic structural diagram of a display substrate 0 according to another embodiment of the present disclosure. Referring to FIG. 2A, the display substrate 0 may include a base substrate 01, a plurality of second light emitting units 03, 04 disposed on the base substrate 01, and the first light emitting unit 02 disposed on the second light emitting units.

The base substrate 01 may be a transparent substrate, which may specifically be a substrate made of a light conductive and non-metallic material having a certain robustness, such as glass, quartz, transparent resin.

The display substrate comprises two second light emitting units, and the two second light emitting units are sequentially superposed between the first light emitting unit 02 and the base substrate 01.

Figures 2B, 3:
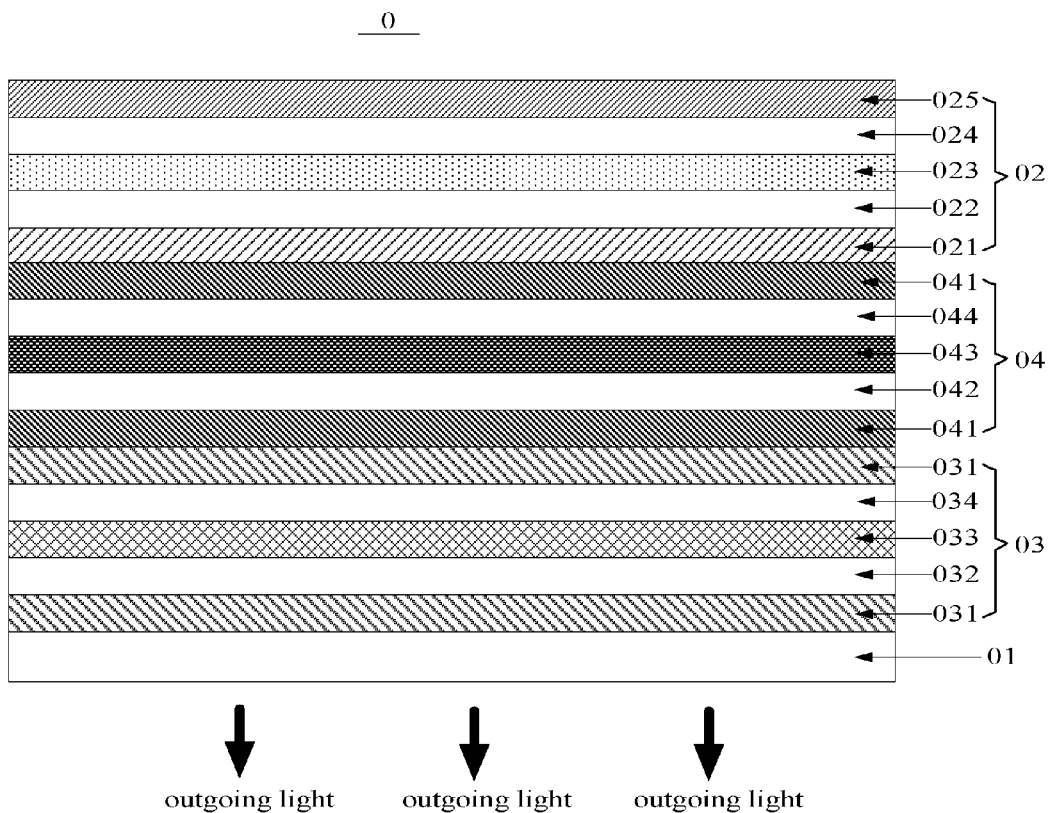
FIG. 2B is a specific schematic structural diagram of the display substrate according to the embodiment shown in FIG. 2A.
FIG. 3 is an exemplary flowchart of a fabricating method of a display substrate provided in an embodiment of the present disclosure.

FIG. 2B shows a specific schematic structural diagram of the display substrate 0 according to the embodiment shown in FIG. 2A. Referring to FIG. 2B, the second light emitting unit 03 includes: two second selective reflection transmission layers 031, and an anode layer 032, a second organic light emitting layer 033 and a cathode layer 034 sequentially superposed between the two second selective reflection transmission layers 031. In this embodiment, the second organic light emitting layer 033 can emit color light under the action of the anode layer 032 and the cathode layer 034, the two second selective reflection transmission layers 031 are capable of reflecting color light emitted from the second organic light emitting layer 033, so that the color light oscillates between the two second selective reflection transmission layers 031, and exits the base substrate 01 via the second selective reflection transmission layer 031 of the second light emitting unit 03 close to the base substrate 01. Illustratively, as shown in FIG. 2B, color light emitted from the second organic light emitting layer 033 exits the base substrate 01 via the second selective reflection transmission layer 031 of the second light emitting unit 03 in contact with the base substrate 01.

Continuously referring to FIG. 2B, the second light emitting unit 04 includes: two second selective reflection transmission layers 041, and an anode layer 042, a second organic light emitting layer 043 and a cathode layer 044 sequentially superposed between the two second selective reflection transmission layers 041. In this embodiment, the second organic light emitting layer 043 can emit color light under the action of the anode layer 042 and the cathode layer 044, the two second selective reflection transmission layers 041 are capable of reflecting color light emitted from the second organic light emitting layer 043, so that the color light oscillates between the two second selective reflection transmission layers 041, enters the second light emitting unit 03 through the second selective reflection transmission layer 041 of the second light emitting unit 04 close to the base substrate 01, and then exits the base substrate 01. Illustratively, shown in FIG. 2B, color light emitted from the second organic light emitting layer 043 is incident on the second light emitting unit 03 through the second selective reflection transmission layer 041 in contact with the second light emitting unit 03 and then exits the base substrate 01 via the second light emitting unit 03.

Continuously referring to FIG. 2B, the first light emitting unit 02 includes: a first selective reflection transmission layer 021, an anode layer 022, a first organic light emitting layer 023, a cathode layer 024 and a reflective layer 025, superposed sequentially. In this embodiment, the first organic light emitting layer 023 can emit color light under the action of the anode layer 022 and the cathode layer 024, the first selective reflection transmission layer 021 and the reflective layer 025 are capable of reflecting color light emitted from the first organic light emitting layer 023, so that the color light oscillates between the first selective reflection transmission layer 021 and the reflective layer 015, passes sequentially through the second light emitting unit 04 and the second light emitting unit 03 via the first selective reflection transmission layer 021, and is then exits the base substrate 01.

In the embodiment described herein, the display substrate 0 includes a first light emitting unit 02 and two second light emitting units 03, 04. The organic light emitting layers of light emitting units among the first light emitting unit 02 and the two second light emitting units 03, 04 are configured to emit light with different color, and the organic light emitting layer of each light emitting unit is configured to emit light with one color.

In one example, the first light emitting unit 02 includes any one of a red light unit, a green light unit and a blue light unit, and each of the two second light emitting units 03, 04 includes any one of the red light unit, the green light unit, and the blue light unit. In this embodiment, the organic light emitting layer of the red light unit is configured to emit red light, the organic light emitting layer of the green light unit is configured to emit green light, and the organic light emitting layer of the blue light unit is configured to emit blue light. Illustratively, the material forming the organic light emitting layer of the red light unit comprises: rhodamine dye, 4-Dicyanomethylene-2-methyl-6-(4-dioctylaminostyryl)-4H-pyran (DCM) or 2-[2-(1-Methylethyl)-6-[2-(2,3,6,7-tetrahydro-1,1,7,7-tetramethyl-1H,5H-benzo[ij]quinolizin-9-yl)ethenyl]-4H-pyran-4-ylidene]propanedinitrile (DCJTI); the material forming the organic light emitting layer of the green light unit comprises: coumarin fluorescent dye, quinacridone, coronene, or aniline fluorescent dye; the material forming the organic light emitting layer of the blue light unit comprises: N-aromatic benzimidazole fluorescent dye, 1,2,4-triazole derivative fluorescent dye, 1,3,4-oxadiazole derivative fluorescence dye or distyrylarylene derivative material; there is no limitation thereto in the embodiments of the present disclosure. Illustratively, in the present embodiment, the second light emitting unit 03 is a red light unit, the second light emitting unit 04 is a green light unit, and the first light emitting unit 02 is a blue light unit. Accordingly, the second organic light emitting layer 033 is configured to emit red light, the material forming the organic light emitting layer 033 comprises: rhodamine dye, DCM or DCJTI; the second organic light emitting layer 043 is configured to emit green light, the material forming the second organic light emitting layer 043 comprises: coumarin fluorescent dye, quinacridone, coronene, or aniline fluorescent dye; the first organic light emitting layer 023 is configured to emit blue light, and the material forming the first organic light emitting layer 023 comprises: N-aromatic benzimidazole fluorescent dye, 1,2,4-triazole derivative fluorescent dye, 1,3,4-oxadiazole derivative fluorescence dye or distyrylarylene derivative material, etc.

Further, in the present embodiment, the second selective reflection transmission layers in the two second light emitting units are different, and each second selective reflection transmission layer is different from the first selective reflection transmission layer of the first light emitting unit 02. Specifically, optical characteristics of the first selective reflection transmission layer and of each second selective reflection transmission layer are different, and optical characteristics of the second selective reflection transmission layers of different the second light emitting units are different. In one example, if the selective reflection transmission layer of one light emitting unit among the first light emitting unit and the two second light emitting units has high reflectivity for light emitted from the organic light emitting layer of the one light emitting unit, it may have high transmittivity for light emitted from the organic light emitting layers of other light emitting units. More specifically, the selective reflection transmission layer of each light emitting unit has reflectivity greater than 60% for light emitted from the organic light emitting layer of the light emitting unit itself, and has transmittivity greater than 60% for light emitted from the organic light emitting layers of other light emitting units. By way of example, optical characteristics of the second selective reflection transmission layer 031, of the second selective reflection transmission layer 041 and of the first selective reflection transmission layer 021 vary, and in particular, the second selective reflection transmission layer 031 has reflectivity greater than 60% for light emitted from the second organic light emitting layer 033, and has transmittivity greater than 60% for light emitted from the second organic light emitting layer 043 and the first organic light emitting layer 023; the second selective reflection transmission layer 041 has reflectivity greater than 60% for light emitted from the second organic light emitting layer 043, and has transmittivity greater than 60% for light emitted from the second organic light emitting layer 033 and the first organic light emitting layer 023; the first selective reflection transmission layer 021 has reflectivity greater than 60% for light emitted from the first organic light emitting layer 023, and has transmittivity greater than 60% for light emitted from the second organic light emitting layer 043 and the second organic light emitting layer 033.

As described above, in this embodiment, the second red light emitting unit 03 may be a red light unit, the second light emitting unit 04 may be a green light unit, and the first light emitting unit 02 may be a blue light unit, whereby the second selective reflection transmissive layer 031 has reflectivity greater than 60% for red light, and has transmittivity greater than 60% for blue light and green light; the second selective reflection transmissive layer 041 has reflectivity greater than 60% for green light, and has transmittivity greater than 60% for red light and green light; the first selective reflection transmission layer 021 has reflectivity greater than 60% for blue light, and has transmittivity greater than 60% for red light and green light.

In the present embodiment, the bandwidth of red light is: 605-780 nm, and the second selective reflection transmission layer 031 can be expressed as:

$$G \left| H'LH' \frac{L}{2} \left( \frac{L}{2} H \frac{L}{2} \right)^7 \right| A \quad (1)$$

wherein, the formula (1) indicates that the second selective reflection transmission layer 031 comprises: one film layer $$H'LH'\frac{L}{2}$$

and seven film layers $$\frac{L}{2} H \frac{L}{2},$$

sequentially superposed. In particular, the film layer $$H'LH'\frac{L}{2}$$

is provided on a glass substrate (film layer G), and comprises four sub film layers sequentially superposed: film layer H' film layer L, film layer H', and film layer $$\frac{L}{2},$$

wherein the film layer H', the film layer L, and the film layer H' each has thickness of $\lambda_0/4$, the film layer $$\frac{L}{2}$$

has thickness of $\lambda_0/8$, and $\lambda_0$ represents control wavelength. 7 film layers $$\frac{L}{2} H \frac{L}{2}$$

are sequentially superposed on the film layer $$H'LH'\frac{L}{2}.$$

Each film layer $$\frac{L}{2} H \frac{L}{2}$$

comprises three sub film layers sequentially superposed: film layer $$\frac{L}{2},$$

film layer H and film layer $$\frac{L}{2},$$

wherein the film layer $$\frac{L}{2}$$

has thickness of $\lambda_0/8$, and the film layer H has thickness H of $\lambda_0/4$. In this embodiment, the film layer G and the film layer A have thickness which is not limited.

In this embodiment, the glass layer G has refractive index $n_G=1.52$, the film layer H' has refractive index $n_{H'}=1.8$, the film layer L has refractive index $n_L=1.46$, the film layer H has refractive index $n_H=2.2$, the air layer A has refractive index $n_A=1.0$, and the control wavelength $\lambda_0$ is equal to 680 nm.

In the present embodiment, the bandwidth of green light is: 510-580 nm, the second selective reflection transmission layer 041 can be expressed as:

$$G|(H'L)^2(HL)^8(H'L)^2L'|A \quad (2)$$

Wherein, the formula (2) indicates that the second selective reflection transmission layer 041 comprises: two film layers H'L, eight film layers HL, two film layers H'L and one film layer L', sequentially superposed. Specifically, two film layers H'L are sequentially superposed on a glass substrate, then the eight film layers HL are sequentially superposed on the two film layers H'L, then the two film layers H'L are sequentially superposed on the eight film layers HL, and then the one film layer L' is provided on the two film layers H'L. Wherein, each film layer H'L comprises two sub film layers sequentially superposed: film layer H' and film layer L, the film layer H' and the film layer L each having thickness of $\lambda_0/4$, wherein $\lambda_0$ represents control wavelength; each film layer HL comprises two sub film layers sequentially superposed: film layer H and film layer L, wherein the film layer H and the film layer L each has thickness of $\lambda_0/4$. In this embodiment, the film layer G and the film layer A have thickness which is not limited.

Wherein, in the formula (2), the glass layer G has refractive index $n_G=1.52$, the film layer H' has refractive index $n_{H'}=1.9$, the film layer L has refractive index $n_L=1.63$, the film layer H has refractive index $n_H=2.2$, the film layer L' has refractive index $n_{L'}=1.46$, the air layer A has refractive index $n_A=1.0$, and the control wavelength $\lambda_0$ is equal to 546 nm.

In the present embodiment, the bandwidth of blue light is: 380-585 nm, the first selective reflection transmission layer 021 can be expressed as:

$$G \left| \left( \frac{H}{2} L \frac{H}{2} \right)^8 \right| A \quad (3)$$

Wherein, the formula (3) indicates that the first selective reflection transmission layer 021 comprises: eight film layers $$\frac{H}{2}L\frac{H}{2}$$

sequentially superposed. Specifically, the eight film layers $$\frac{H}{2}L\frac{H}{2}$$

are sequentially superposed on a glass substrate (film layer G), and each film layer $$\frac{H}{2}L\frac{H}{2}$$

comprises three sub film layers sequentially superposed: film layer $$\frac{H}{2},$$

film layer L and film layer $$\frac{H}{2}.$$

The film layer L has thickness of $\lambda_0/4$, the film layer $$\frac{H}{2}$$

has thickness of $\lambda_0/8$ and $\lambda_0$ represents control wavelength. In this embodiment, the film layer G and the film layer A have thickness which is not limited.

Wherein, in the formula (3), the glass layer G has refractive index $n_G=1.52$, the film layer H has refractive index $n_H=2.2$, the film layer L has refractive index $n_L=1.46$, the air layer A has refractive index $n_A=1.0$, and the control wavelength $\lambda_0$ is equal to 440 nm.

In the embodiment described herein, the reflective layer 025 has reflectivity greater than 60% for light emitted from the organic light emitting layer of each light emitting unit, which may help more light be reflected and exit the base substrate 01, increasing luminance of the display substrate 0 and improving the utilization of light. Illustratively, the reflective layer 025 may be implemented using a distributed Bragg reflection (DBR).

In the embodiment of the present disclosure, the organic light emitting layer of each light emitting unit includes but is not limited to the OLED layer, and the anode and cathode layers of each light emitting unit include but are not limited to Indium Tin Oxide (ITO) film layers.

As described above, the display substrate provided in the present embodiment includes a base substrate, two second light emitting units disposed on the base substrate, and a first light emitting unit provided on the two second light emitting units. By appropriately setting the selective reflection transmission layer of each light emitting unit, to make light emitted from the first light emitting unit oscillate between the reflective layer and the first selective reflection transmission layer, and light emitted from the second light emitting unit oscillate between the two second selective reflection transmission layers, a resonance effect is generated, so that the light intensity increases and the energy of most of the light is concentrated in the direction perpendicular to its outgoing surface. Since the outgoing direction of most of the light is perpendicular or nearly perpendicular to its outgoing surface, total reflection of light is avoided. Therefore, the light outgoing efficiency can be improved, and also light loss can be reduced and light utilization can be improved.

In a related OLED superposing structure, when the light emitted from the organic light emitting layer passes through the various layers, due to the total reflection on the surface of the base substrate, the total reflection on the air interface and the waveguide effect of the organic light emitting layer, most of the light will be lost. Typically, 30% of the light propagate within the base substrate and cannot be coupled to the air, 50% of the light propagates in the cathode layer, the anode layer and the organic light emitting layer in a waveguide mode and cannot be coupled to the air, while only the light with a large angle from the outgoing surface can propagate into the air. If devices are not processed anyway, when the refractive index of the organic light emitting layer is 1.70, the output coupling efficiency of small molecules of the organic light emitting layer is 17%, the output coupling efficiency of polymer is 26%. The output coupling efficiencies are low, and this phenomenon is particularly serious in the case of superposed OLED devices. In a superposed OLED device, the light emitting from a light emitting unit away from the base substrate will not only be consumed by its own total internal reflection, but also be consumed by other light emitting units when passing through the other light emitting units, with a low light outgoing efficiency. By appropriately setting the selective reflection transmission layer in the embodiment of the present disclosure to make light oscillate between the selective reflection transmission layers, the outgoing direction of light can be adjusted so that the outgoing direction of light is perpendicular to a light outgoing surface of the display substrate, whereby the occurrence of total reflection of light may be avoided, improving the light outgoing efficiency of the display substrate.

The display substrate provided in the embodiments of the disclosure may be applied to the method in the following text, and the fabricating method and fabricating principle of the display substrate in the embodiments of the disclosure will be described by with reference to the various embodiments in the following text.

FIG. 3 shows an exemplary flowchart of a fabricating method of a display substrate provided in one embodiment of the present disclosure. The fabricating method of the display substrate can be used to fabricate the display substrate 0 described herein. The display substrate 0 may include a base substrate 01, which may be a transparent substrate, and may specifically be a substrate made of light guiding and non-metal material having a certain robustness, such as glass, quartz, transparent resin.

Referring to FIG. 3, the fabricating method of the display substrate may include:

Step 301: forming a first light emitting unit on a base substrate. The forming a first light emitting unit on a base substrate comprises: sequentially forming, on the base substrate, a first selective reflection transmission layer, an anode layer, a first organic light emitting layer, a cathode layer, and a reflective layer.

In this embodiment, the first organic light emitting layer can emit color light under the action of the anode and cathode layers, the first selective reflection transmission layer and the reflective layer are capable of reflecting color light, so that the color light oscillates between the first selective reflection transmission layer and the reflective layer, and exits the base substrate via the first selective reflection transmission layer.

As described above, according to the fabricating method of the display substrate provided in the present embodiment, the first light emitting unit is obtained by sequentially forming, on the base substrate, the first selective reflection transmission layer, the anode layer, the first organic light emitting layer, the cathode layer and the reflective layer. The first organic light emitting layer can emit color light under the action of the anode and cathode layers, the first selective reflection transmission layer and the reflective layer are capable of reflecting color light, so that the color light oscillates between the first selective reflection transmission layer and the reflective layer, and exits the base substrate via the first selective reflection transmission layer. Since the color light oscillates between the first selective reflection transmission layer and the reflective layer, the outgoing direction of light can be adjusted so that the outgoing direction of light is perpendicular to a light outgoing surface of the display substrate, the occurrence of total reflection of light is avoided, improving the light outgoing efficiency of the display substrate.

In another embodiment, before Step 301, the fabricating method of the display substrate may further comprise:

forming a plurality of second light emitting units on the base substrate, each second light emitting unit comprising: an anode layer, a second organic light emitting layer, a cathode layer, and two second selective reflection transmission layers.

Specifically, a method for forming each second light emitting unit on the base substrate comprises: sequentially forming, on the base substrate, one of the two second selective reflection transmission layers, the anode layer, the second organic light emitting layer, the cathode layer, and the other of the two second selective reflection transmission layers.

In the present embodiment, the second light emitting units are located between the base substrate and the first light emitting unit; the second organic light emitting layer can emit color light under the action of the anode and cathode layers of the second light emitting units. The two second selective reflection transmission layers are capable of reflecting color light, so that the color light oscillates between the two second selective reflection transmission layers, and exits the base substrate via the second selective reflection transmission layer of the second light emitting units close to the base substrate.

In one optional embodiment, the number of the second light emitting unit is two, the two second light emitting units are sequentially superposed between the first light emitting unit and the base substrate, and optical characteristics of the second selective reflection transmission layers of the two second light emitting units are different.

In one optional embodiment, the organic light emitting layers of light emitting units the first light emitting unit and the two second light emitting units are configured to emit light with different color, and the organic light emitting layer of each light emitting unit is configured to emit light with one color.

In one optional embodiment, the reflective layer has reflectivity greater than 60% for light emitted from the organic light emitting layer of each light emitting unit among the first light emitting unit and the two second light emitting units;

The selective reflection transmission layer of any one light emitting unit among the first light emitting unit and the two second light emitting units has reflectivity greater than 60% for light emitted from the organic light emitting layer of the any one light emitting unit, and has transmittivity greater than 60% for light emitted from the organic light emitting layers of other light emitting units.

Any combination of all of the above optional technical solutions may be used to form optional embodiments of the present disclosure.

As described above, according to the fabricating method of the display substrate provided in the present embodiment, the first light emitting unit is obtained by sequentially forming, on the base substrate, the first selective reflection transmission layer, the anode layer, the first organic light emitting layer, the cathode layer and the reflective layer. The first organic light emitting layer can emit color light under the action of the anode and cathode layers, the first selective reflection transmission layer and the reflective layer are capable of reflecting color light, so that the color light oscillates between the first selective reflection transmission layer and the reflective layer, and exits the base substrate via the first selective reflection transmission layer. Since, when the color light oscillates between the first selective reflection transmission layer and the reflective layer, the outgoing direction of light can be adjusted so that the outgoing direction of light is perpendicular to a light outgoing surface of the display substrate, the occurrence of total reflection of light is avoided, improving the light outgoing efficiency of the display substrate.

Figure 4:
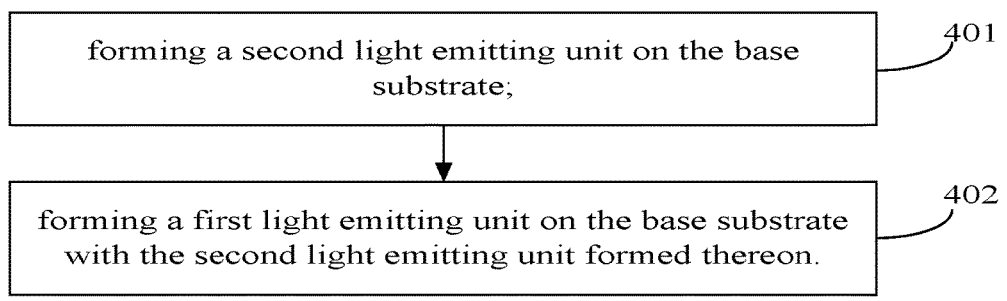
FIG. 4 is an exemplary flowchart of a fabricating method of a display substrate provided in another embodiment of the present disclosure.

FIG. 4 shows an exemplary flowchart of a fabricating method of a display substrate provided in another embodiment of the present disclosure. The fabricating method of the display substrate can be used to fabricate the display substrate 0 shown in FIG. 2B. In the present embodiment, the display substrate 0 may include a base substrate 01, which may be a transparent substrate, and may specifically be a substrate made of light guiding and non-metal material having a certain robustness, such as glass, quartz, transparent resin.

Referring to FIG. 4, the fabricating method of the display substrate may include:

Step 401: forming a plurality of second light emitting unit on a base substrate.

Step 402: forming a first light emitting unit on the base substrate with the second light emitting units formed thereon.

Various steps of the fabricating method of the display substrate provided in the present embodiment are described in detail in combination with the drawings.

In the present embodiment, the number of the second light emitting units is two. Therefore, in Step 401, the forming a plurality of second light emitting unit on a base substrate may comprise: sequentially forming two second light emitting units on the base substrate so that the two second light emitting units are sequentially superposed.

Figure 5:
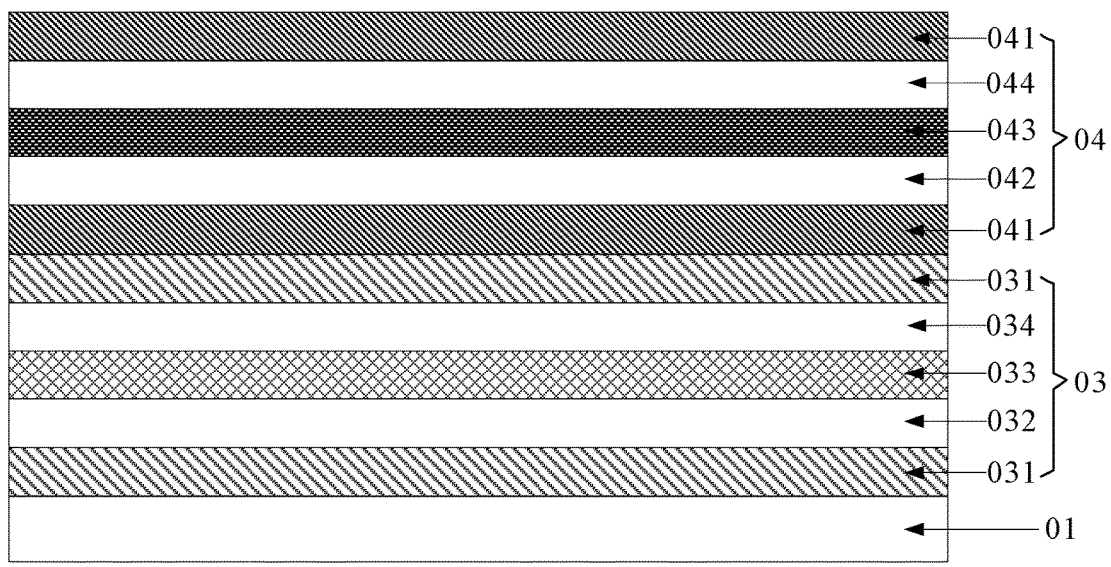
FIG. 5 is a schematic structural diagram of the display substrate after two second light emitting units are formed on the base substrate according to the embodiment shown in FIG. 4.

FIG. 5 is a schematic structural diagram of the display substrate after the second light emitting units are formed on the base substrate 01 according to the embodiment shown in FIG. 4. Referring to FIG. 5, the base substrate 01 has the second light emitting unit 03 and the second light emitting unit 04 sequentially formed thereon. The second light emitting unit 03 includes: two second selective reflection transmission layers 031, as well as an anode layer 032, a second organic light emitting layer 033 and a cathode layer 034 sequentially superposed between the two second selective reflection transmission layers 031. The second light emitting unit 04 includes: two second selective reflection transmission layers 041, as well as an anode layer 042, a second organic light emitting layer 043 and a cathode layer 044 sequentially superposed between the two second selective reflection transmission layers 041.

In the following description, the method of forming the second light emitting unit 03 will be described in detail in the present embodiment. It should be known that the process of forming the second light emitting unit 04 is the same as that of the second light emitting unit 03.

Alternatively, the forming the second light emitting unit 03 on the base substrate 01 may include: sequentially forming, on the base substrate 01, one of the two second selective reflection transmission layers 031, the anode layer 032, the second organic light emitting layer 033, the cathode layer 034, and the other of the two second selective reflection transmission layers 031.

Figure 6:
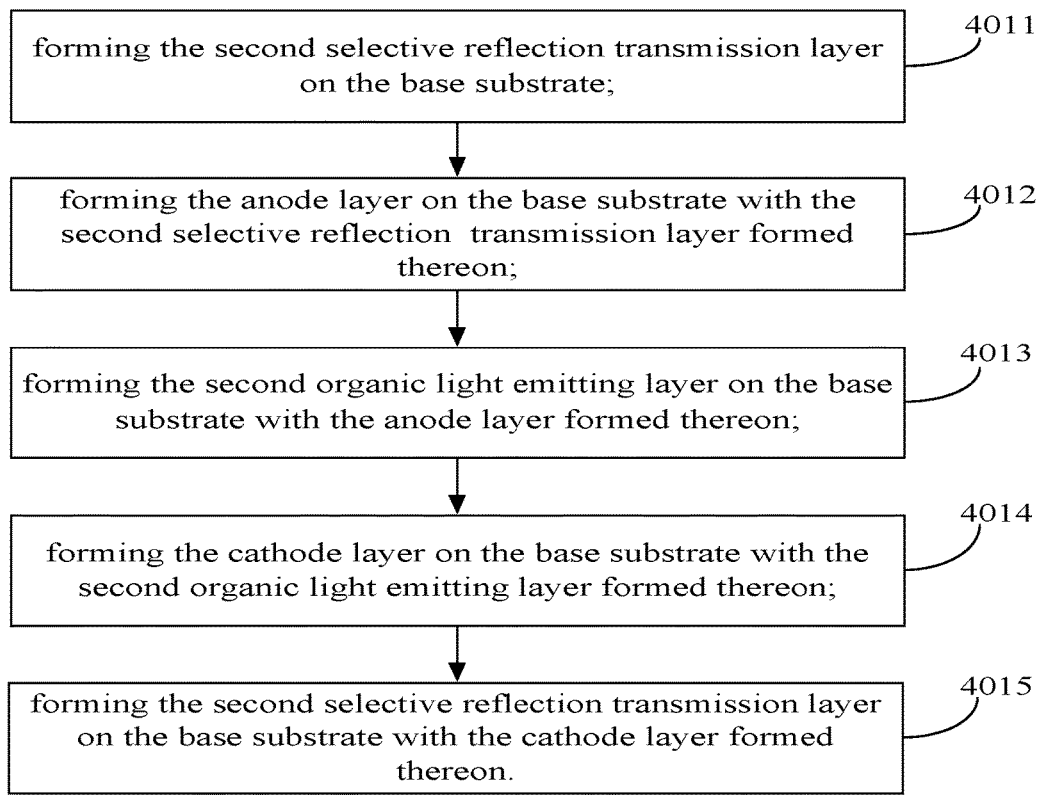
FIG. 6 is an exemplary flowchart of a method of forming the second light emitting unit on the base substrate provided in the embodiment shown in FIG. 4.

FIG. 6 shows an exemplary flowchart of a method of forming the second light emitting unit 03 on the base substrate 01 provided in the embodiment shown in FIG. 4. Referring to FIG. 6, the method may include:

Sub-step 4011: forming the second selective reflection transmission layer on the base substrate;

Sub-step 4012: forming the anode layer on the base substrate with the second selective reflection transmission layer formed thereon;

Sub-step 4013: forming the second organic light emitting layer on the base substrate with the anode layer formed thereon;

Sub-step 4014: forming the cathode layer on the base substrate with the second organic light emitting layer formed thereon;

Sub-step 4015: forming the second selective reflection transmission layer on the base substrate with the cathode layer formed thereon.

Figure 7A:
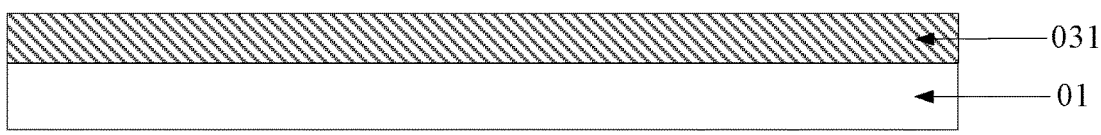
FIG. 7A is a schematic structural diagram of the display substrate after a second selective reflection transmission layer is formed on the base substrate according to the embodiment shown in FIG. 6.

FIG. 7A shows a schematic structural diagram of the display substrate after a second selective reflection transmission layer 031 is formed on the base substrate 01 according to the embodiment shown in FIG. 6. As described in detail above, the second selective reflection transmission layer 031 includes: one film layer $$H'LH'\frac{L}{2}$$

and seven film layers $$\frac{L}{2}H\frac{L}{2}$$

sequentially superposed, and the film layer $$H'LH'\frac{L}{2}$$

comprises four sub film layers sequentially superposed, each film layer $$\frac{L}{2}H\frac{L}{2}$$

comprising three sub film layers sequentially superposed. In sub-step 4011, the four-times patterning processes may be used to form the film layer $$H'LH'\frac{L}{2}$$

on the base substrate 01, then seven-times same operations will be used to form the seven film layers $$\frac{L}{2}H\frac{L}{2},$$

each operation including the three-times patterning process. By way of example, the four-times patterning processes comprise: using a first-time patterning process to form the film layer H' on the base substrate 01; using a second-time patterning process to form the film layer L on the base substrate 01 with the film layer H' formed thereon; using a third-time patterning process to form the film layer H' on the base substrate 01 with the film layer L formed thereon; using a fourth-time patterning process to form the film layer $$\frac{L}{2}$$

on the base substrate 01 with the film layer H' formed thereon. Using the three-times patterning processes to form the film layer $$\frac{L}{2}H\frac{L}{2}$$

comprises: using a first-time patterning process to form the film layer $$\frac{L}{2}$$

on the base substrate 01 with the film layer $$\frac{L}{2}$$

formed thereon; using a second-time patterning process to form the film layer L on the base substrate 01 with the film layer $$\frac{H}{2}$$

formed thereon; using a third-time patterning process to form the film layer on the base substrate 01 with the film layer L formed thereon.

As described in the above embodiment, in a case where the second light emitting unit 03 is a red light unit, the second selective reflection transmission layer 031 has a high reflectivity for red light and a high transmittivity for light with other colors. Illustratively, the second selective reflection transmission layer 031 has a high reflectivity for red light greater than 60% and a high transmittivity for green light and blue light greater than 60%.

Figure 7B:
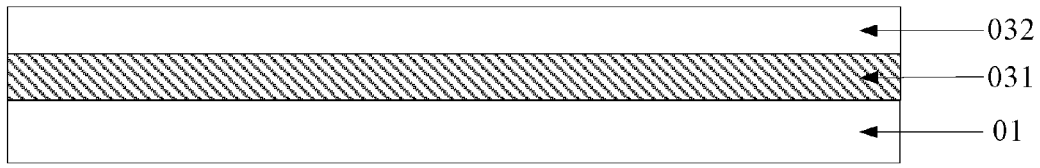
FIG. 7B is a schematic structural diagram of the display substrate after an anode layer is formed on the base substrate with the second selective reflection transmission layer formed thereon according to the embodiment shown in FIG. 6.

FIG. 7B shows a schematic structural diagram of the display substrate after an anode layer 032 is formed on the base substrate 01 with the second selective reflection transmission layer 031 formed thereon (sub-step 4012) according to the embodiment shown in FIG. 6. In sub-step 4012, it is possible to use ITO as the material and use a one-time patterning process to form the anode layer 032 on the base substrate 01 with the second selective reflective transmissive layer 031 formed thereon. The one-time patterning process may include: photoresist coating, exposuring, developing, etching, photoresist stripping. Therefore, with ITO as the material, the using the one-time patterning process to form the anode layer 032 on the base substrate 01 with the second selective reflective transmissive layer 031 formed thereon may include: using the method such as coating, magnetron sputtering, thermal evaporation or Plasma enhanced chemical vapor deposition (PECVD) to form an ITO film layer having a certain thickness on the base substrate 01 with the second selective reflection transmission layer 031 formed thereon; coating photoresist with a certain thickness on the ITO film layer; exposing the photoresist using a mask, so as to form a completely-exposed area and a non-exposed area of photoresist; thereafter processing with a developing process, so that photoresist in the completely exposed area is completely removed while photoresist in the non-exposed area is reserved; etching the area on the ITO film layer corresponding to the completely-exposed area using an etching process, thereafter stripping the photoresist in the non-exposed area, so that the area on the ITO film layer corresponding to the non-exposed area forms the anode layer 032.

It should be noted that the present embodiment is described by example of using a positive photoresist to form the anode layer 032, while in actual applications, a negative photoresist may also be used to form the anode layer 032.

Figure 7C:
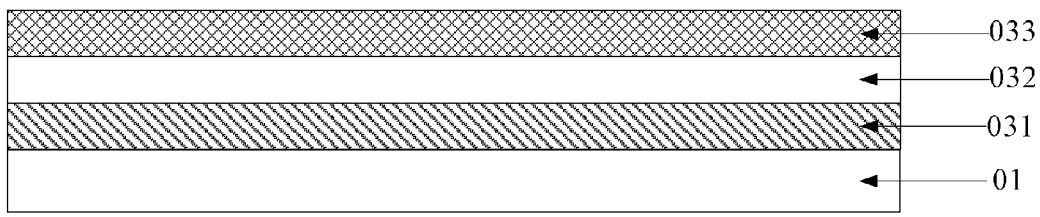
FIG. 7C is a schematic structural diagram of the display substrate after a second organic light emitting layer is formed on the base substrate with the anode layer formed thereon according to the embodiment shown in FIG. 6.

FIG. 7C illustrates a schematic structural diagram of the display substrate after a second organic light emitting layer 033 is formed on the base substrate 01 with the anode layer 032 formed thereon (sub-step 4013) according to the embodiment shown in FIG. 6. In step 4013, organic materials may be used to form the second organic light emitting layer 033 on the base substrate 01 with the anode substrate layer 032 formed thereon by a one-time patterning process. In this step, for the specific process of the one-time patterning process, one can refer to sub-step 4012 which is not described any more here.

In one embodiment, the second organic light emitting layer 033 may be used to emit red light, whereby the materials forming the second organic light emitting layer 033 specifically may include, but are not limited to rhodamine dyes, DCM or DCJTI and other.

Figure 7D:
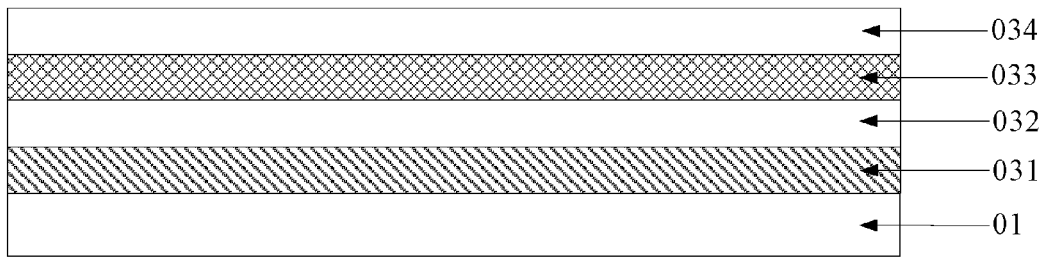
FIG. 7D is a schematic structural diagram of the display substrate after a cathode layer is formed on the base substrate with the second organic light emitting layer formed thereon according to the embodiment shown in FIG. 6.

FIG. 7D shows a schematic structural diagram of the display substrate after a cathode layer 034 is formed on the base substrate 01 with the second organic light emitting layer 033 formed thereon (sub-step 4014) according to the embodiment shown in FIG. 6. In sub-step 4014, the process of forming the cathode layer 034 may use the same method as in the process of forming the anode layer 032 in sub-step 4012, and will not be described any more herein.

Figure 7E:
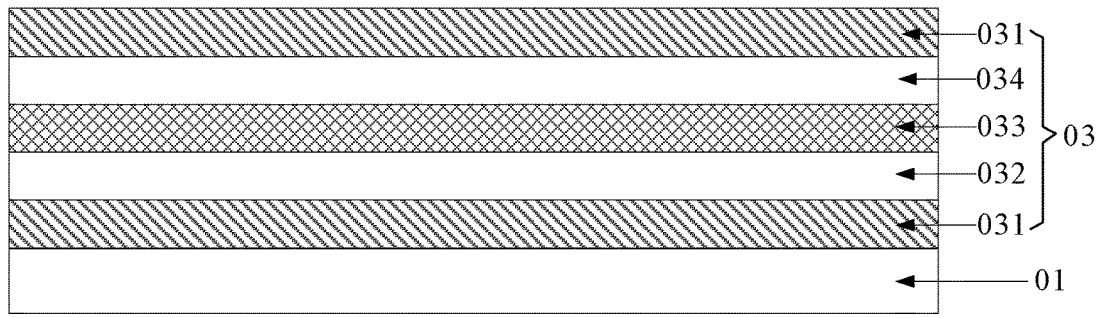
FIG. 7E is a schematic structural diagram of the display substrate after a second selective reflection transmission layer is formed on the base substrate with the cathode layer formed thereon according to the embodiment shown in FIG. 6.

FIG. 7E shows a schematic structural diagram of the display substrate after a second selective reflection transmission layer 031 is formed on the base substrate 01 with the cathode layer 034 formed thereon (sub-step 4015) according to the embodiment shown in FIG. 6. In sub-step 4015, the process of forming the second selective reflection transmission layer 031 may use the same method as in sub-step 4011, and will not be described any more herein.

In the present embodiment, the second organic light emitting layer 033 can emit red light under the action of the anode layer 032 and the cathode layer 034, the two second selective reflection transmission layers 031 are capable of reflecting the red light, so that the red light oscillates between the two second selective reflection transmission layers 031, and finally exit the base substrate 01 via the second selective reflection transmission layer 031 close to the base substrate 01.

It should be further noted that, in the embodiment of the disclosure, the process of forming each layer of the second light emitting unit 04 can refer to the embodiment shown in FIG. 6, and the schematic structural diagram of the display substrate after the second light emitting unit 04 is formed may be as shown in FIG. 5. In addition, as mentioned in the above embodiment, in a case where the second light emitting unit 04 is a green light unit, the second selective reflection transmission layer 041 of the second light emitting unit 04 has a high reflectivity for green light and a high transmittivity for light with other colors. Illustratively, the second selective reflection transmission layer 041 has a high reflectivity for green light greater than 60% and a high transmittivity for red light and blue light greater than 60%, and the materials forming the second organic light emitting layer 043 of the second light emitting unit 04 specifically may include, but are not limited to coumarin fluorescent dye, quinacridone, coronene, or aniline fluorescent dye.

Figure 7F:
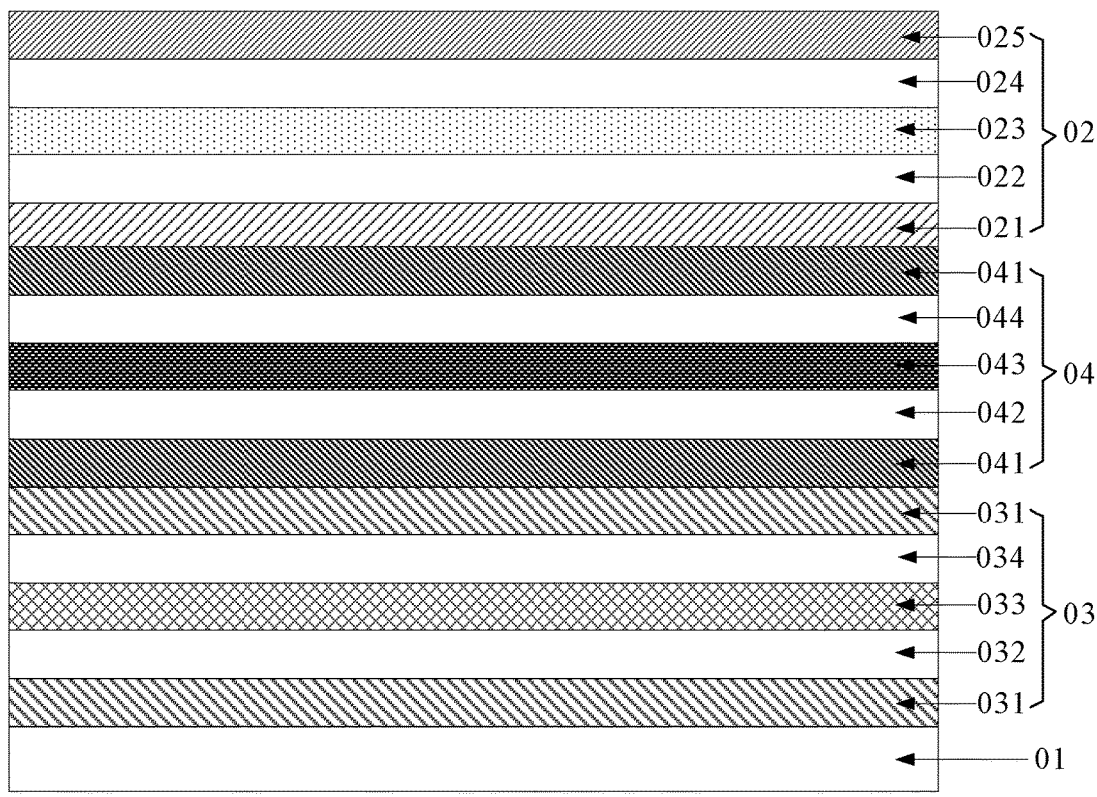
FIG. 7F is a schematic structural diagram of the display substrate after a first light emitting unit is formed on the base substrate with the second light emitting units formed thereon according to the embodiment shown in FIG. 4.

FIG. 7F shows a schematic structural diagram of the display substrate after a first light emitting unit 02 is formed on the base substrate 01 with the second light emitting units formed thereon (step 402) according to the embodiment shown in FIG. 4. Referring to FIG. 7F, the first light emitting unit 02 comprises a first selective reflection transmission layer 021, an anode layer 022, a first organic light emitting layer 023, a cathode layer 024 and a reflective layer 025. Thus, forming a first light emitting unit 02 on the base substrate 01 with the second light emitting units formed thereon includes sequentially forming, on the base substrate 01 with the second light emitting units formed thereon, a first selective reflection transmission layer 021, an anode layer 022, a first organic light emitting layer 023, a cathode layer 024 and a reflective layer 025.

Figure 8:
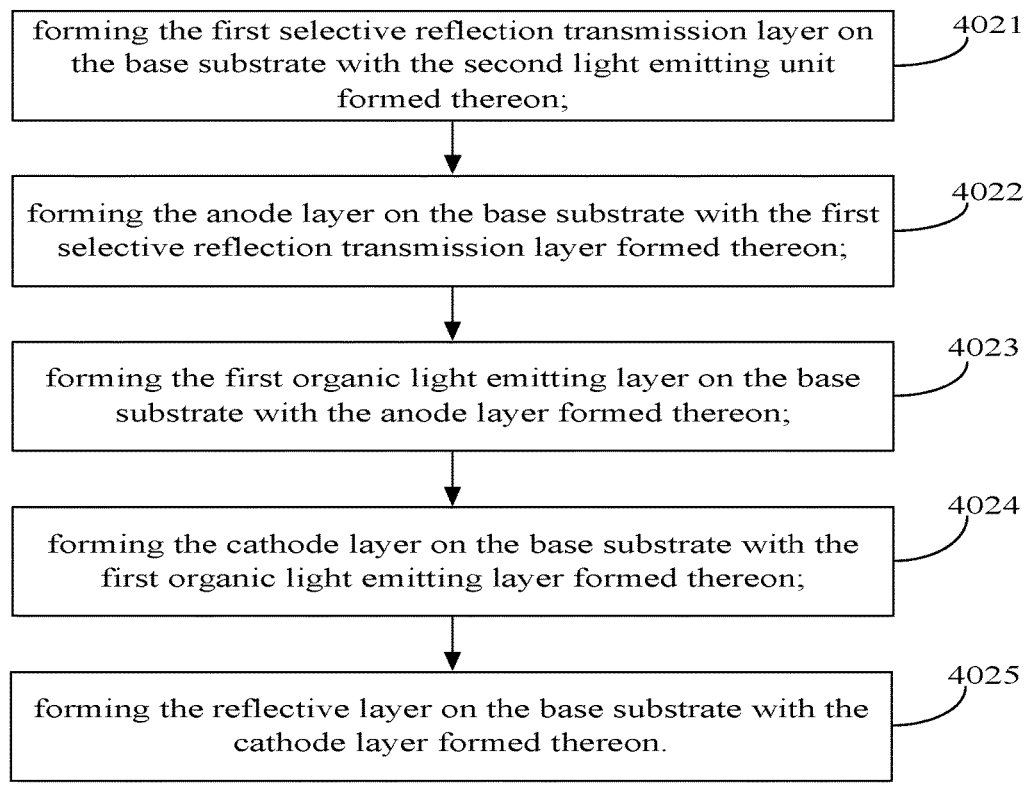
FIG. 8 is an exemplary flowchart of a method of forming the first light emitting unit on the base substrate with the second light emitting units formed thereon according to the embodiment shown in FIG. 4.

FIG. 8 shows an exemplary flowchart of a method of forming the first light emitting unit 02 on the base substrate 01 with the second light emitting units formed thereon according to the embodiment shown in FIG. 4. Referring to FIG. 8, the method may comprise:

Sub-step 4021: forming the first selective reflection transmission layer on the base substrate with the second light emitting units formed thereon;

Sub-step 4022: forming the anode layer on the base substrate with the first selective reflection transmission layer formed thereon;

Sub-step 4023: forming the first organic light emitting layer on the base substrate with the anode layer formed thereon;

Sub-step 4024: forming the cathode layer on the base substrate with the first organic light emitting layer formed thereon;

Sub-step 4025: forming the reflective layer on the base substrate with the cathode layer formed thereon.

Figure 9A:
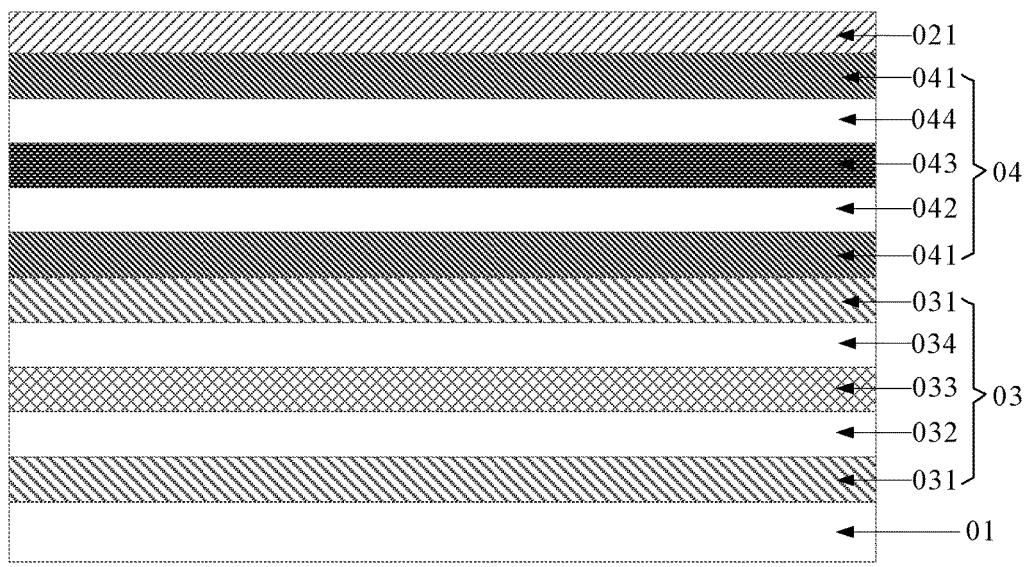
FIG. 9A is a schematic structural diagram of the display substrate after a first selective reflection transmission layer is formed on the base substrate with the second light emitting units formed thereon according to the embodiment shown in FIG. 8.

FIG. 9A shows a schematic structural diagram of the display substrate after a first selective reflection transmission layer 021 is formed on the base substrate 01 with the second light emitting units formed thereon (sub-step 4021) according to the embodiment shown in FIG. 8. As described in the above embodiment in detail, the first selective reflection transmission layer 021 comprises: eight film layers $$\frac{H}{2}L\frac{H}{2},$$

and each film layer $$\frac{H}{2}L\frac{H}{2}$$

comprises three sub film layers sequentially superposed. In sub-step 4021, the three-times patterning process may be used to form one film layer $$\frac{H}{2}L\frac{H}{2}$$

on the base substrate 01 with the second light emitting units formed thereon, then the same operation will be executed repetitively eight times to form the first selective reflection transmission layer 021. By way of example, a first-time patterning process is used to form the film layer $$\frac{H}{2}$$

on the base substrate 01 with the second light emitting units formed thereon; a second-time patterning process is used to form the film layer L on the base substrate 01 with the film layer $$\frac{H}{2}$$

formed thereon; a third-time patterning process is used to form the film layer $$\frac{H}{2}$$

on me base substrate 01 with the film layer L formed thereon.

As mentioned in the above embodiment, in a case where the first light emitting unit 02 is a blue light unit, the first selective reflection transmission layer 021 has a high reflectivity for blue light and a high transmittivity for light with other colors. Illustratively, the first selective reflection transmission layer 021 has a high reflectivity for blue light greater than 60% and a high transmittivity for red light and blue light greater than 60%.

Figure 9B:
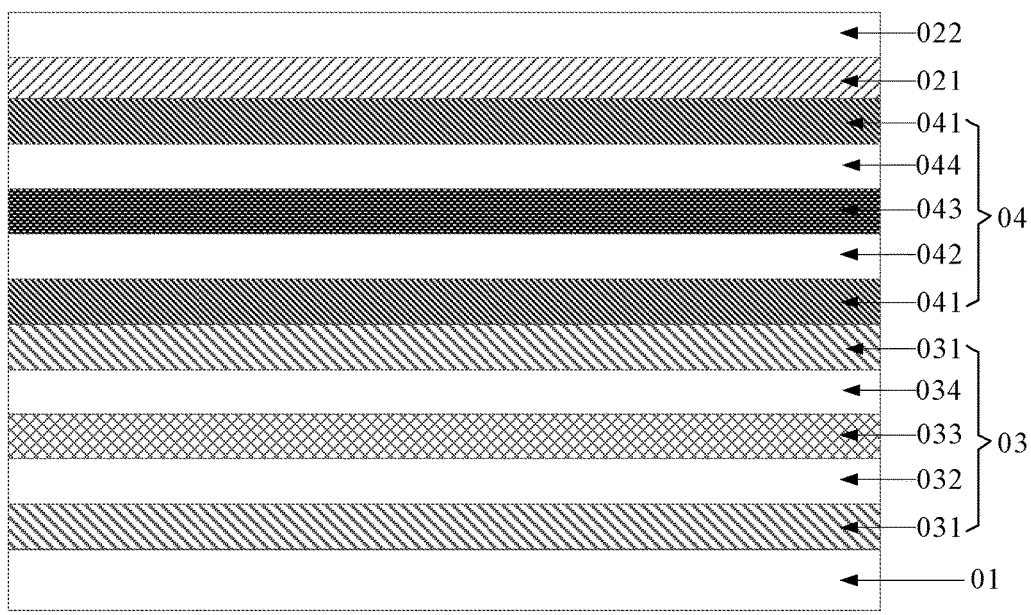
FIG. 9B is a schematic structural diagram of the display substrate after the anode layer is formed on the base substrate with the first selective reflection transmission layer formed thereon according to the embodiment shown in FIG. 8.

FIG. 9B shows a schematic structural diagram of the display substrate after the anode layer 022 is formed on the base substrate 01 with the first selective reflection transmission layer 021 formed thereon (sub-step 4022) according to the embodiment shown in FIG. 8. In sub-step 4022, the process of forming the anode layer 022 may employ a method similar to sub-step 4012 of the embodiment shown in FIG. 6, and will not be described any more here.

Figure 9C:
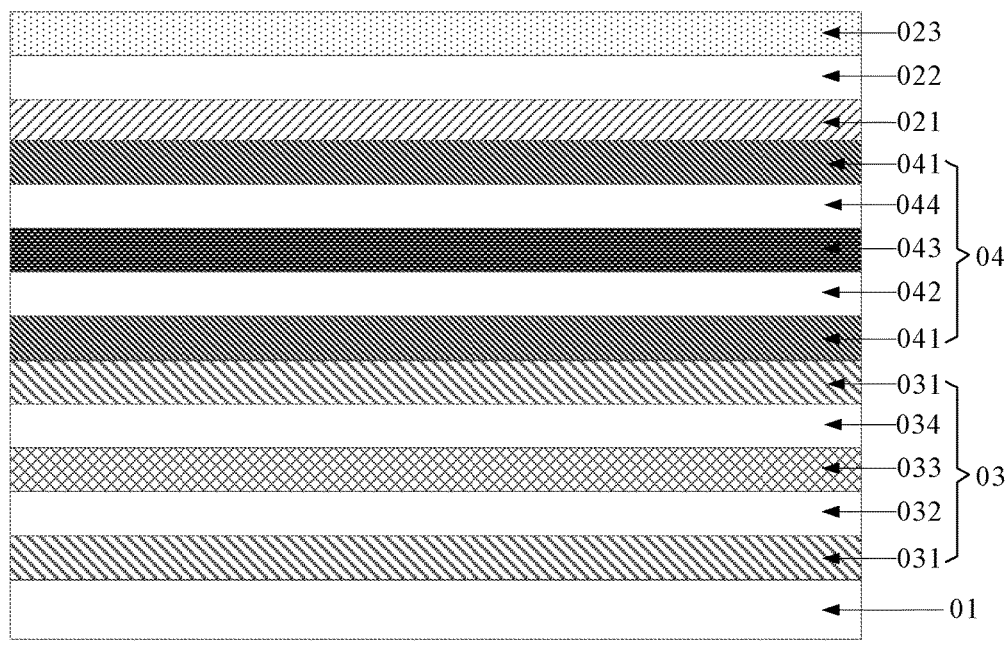
FIG. 9C is a schematic structural diagram of the display substrate after the first organic light emitting layer is formed on the base substrate with the anode layer formed thereon according to the embodiment shown in FIG. 8.

FIG. 9C shows a schematic structural diagram of the display substrate after the first organic light emitting layer 023 is formed on the base substrate 01 with the anode layer 022 formed thereon (sub-step 4023) according to the embodiment shown in FIG. 8. In sub-step 4023, organic materials may be used to form the first organic light emitting layer 023 on the base substrate 01 with the anode substrate layer 022 formed thereon by a one-time patterning process. The specific process of the one-time patterning process may employ the method similar to the sub-step 4012, and will not be described any more here.

As mentioned in the above embodiment, in a case where the first organic light emitting layer 023 is configured to emit blue light, the materials forming the first organic light emitting layer 023 may include, but are not limited to N-aromatic benzimidazole fluorescent dye, 1,2,4-triazole derivative fluorescent dye, 1,3,4-oxadiazole derivative fluorescence dye or distyrylarylene derivative material.

Figure 9D:
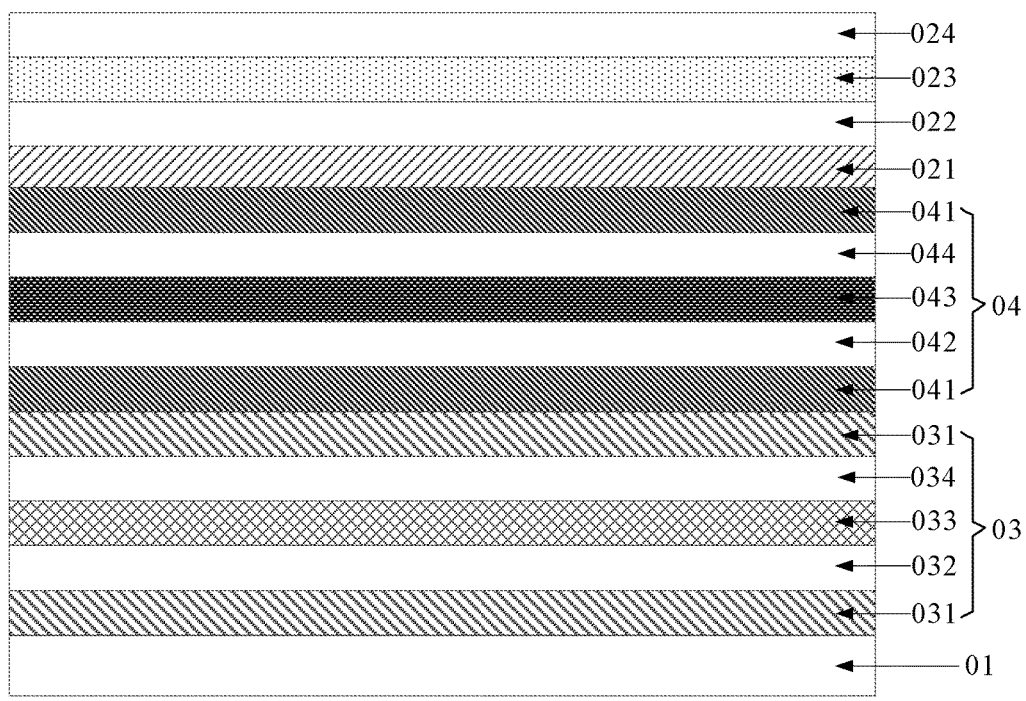
FIG. 9D is a schematic structural diagram of the display substrate after the cathode layer is formed on the base substrate with the first organic light emitting layer formed thereon according to the embodiment shown in FIG. 8.

FIG. 9D shows a schematic structural diagram of the display substrate after the cathode layer 024 is formed on the base substrate 01 with the first organic light emitting layer 023 formed thereon (sub-step 4024) according to the embodiment shown in FIG. 8. In sub-step 4024, the process of forming the cathode layer 024 may employ a method similar to the process of forming the anode layer 032 in sub-step 4012 in the embodiment shown in FIG. 6, and will not be described any more here.

In sub-step 4025, the schematic structural diagram of the display substrate after the reflective layer 025 is formed on the base substrate 01 with the cathode layer 024 formed thereon is as shown in FIG. 7F, and the reflective layer 025 may be implemented using a distributed Bragg reflection. In the present embodiment, the reflective layer 025 has reflectivity greater than 60% for red light emitted from the second organic light emitting layer 033, reflectivity greater than 60% for green light emitted from the second organic light emitting layer 043, and reflectivity greater than 60% for blue light emitted from the first organic light emitting layer 023, whereby more light may be reflected and exit the base substrate 01, increasing the luminance of the display substrate 0 and improving light utilization.

As described above, according to the fabricating method of the display substrate provided in the present embodiment, when the first light emitting unit is formed, the reflective layer and the first selective reflection transmission layer are formed on both sides thereof, and when the second light emitting units are formed, the second selective reflection transmission layers are formed respectively on both sides thereof. By appropriately setting the selective reflection transmission layer of each light emitting unit to make light emitted from the first light emitting unit oscillate between the reflective layer and the first selective reflection transmission layer, and light emitted from the second light emitting units oscillates between the two second selective reflection transmission layers, a resonance effect is generated, so that the light intensity increases and the energy of most of the light is concentrated in the direction perpendicular to its outgoing surface. Since the outgoing direction of most of the light is perpendicular or nearly perpendicular to its outgoing surface, total reflection of light is avoided. Therefore, the light outgoing efficiency can be improved, and at the same time light loss can also be reduced and light utilization can be improved.

An embodiment of the present disclosure further provides a display device, which may comprise the display substrate 0 in any embodiment described herein. Illustratively, the display device may be: electronic paper, mobile phone, tablet computer, television, display, laptop, camera, video camera, digital photo frame, navigator and any other product or component having a display function.

It should be noted that the structure of the display substrate 0 has been described in detail in the aforementioned embodiments, and will not be repeated in the embodiments of the disclosure.

As described above, the display device provided in the present embodiment includes the display substrate, the base substrate of the display substrate is provided with the first light emitting unit, the first light emitting unit comprising: the first selective reflection transmission layer, the anode layer, the first organic light emitting layer, the cathode layer and the reflective layer, sequentially superposed. The first organic light emitting layer can emit color light under the action of the anode and cathode layers, the first selective reflection transmission layer and the reflective layer can reflect color light, so that color light oscillates between the first selective reflection transmission layer and the reflective layer, and then exit the base substrate via the first selective reflection transmission layer. Since, when the color light oscillates between the first selective reflection transmission layer and the reflective layer, the outgoing direction of light can be adjusted so that the outgoing direction of light is perpendicular to a light outgoing surface of the display substrate, the occurrence of total reflection of light is avoided, improving the light outgoing efficiency of the display substrate.

Those of ordinary skill in the art will appreciate that all or part of the steps for implementing the above-described embodiments may be accomplished by hardware, and may be accomplished by a program instructing relevant hardware. Said program may be stored in a computer readable storage medium, and the mentioned storage medium may be a read-only memory, a magnetic or optical disk.

For purposes of the description hereinafter, the terms "upper", "lower", "right", "left", "vertical", "horizontal", "top", "bottom", and derivatives thereof shall relate to the disclosure, as it is oriented in the drawing figures. The terms "overlying", "atop", "positioned on" or "positioned atop", "disposed on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. Where used herein the term "examples," particularly when followed by a listing of terms is merely exemplary and illustrative, and should not be deemed to be exclusive or comprehensive.

The foregoing description of the embodiments has been provided for purpose of illustration and description. It is not intended to be exhaustive or to limit the application. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the application, and all such modifications are included within the scope of the application.

The invention claimed is:

1. A display substrate, comprising: a base substrate, and a first light emitting unit disposed on the base substrate, the first light emitting unit comprising: a first selective reflection transmission layer, an anode layer, a first organic light emitting layer, a cathode layer and a reflective layer, superposed sequentially, wherein the first selective reflection transmission layer and the reflective layer are capable of reflecting color light emitted from the first organic light emitting layer, so that the color light oscillates between the first selective reflection transmission layer and the reflective layer, and exits the base substrate via the first selective reflection transmission layer.

2. The display substrate according to claim 1, further comprising a plurality of second light emitting units disposed between the first light emitting unit and the base substrate, each second light emitting unit comprising: two second selective reflection transmission layers, and an anode layer, a second organic light emitting layer and a cathode layer superposed sequentially between the two second selective reflection transmission layers, wherein the two second selective reflection transmission layers are capable of reflecting color light emitted from the second organic light emitting layer, so that the color light oscillates between the two second selective reflection transmission layers, and exits the base substrate via the second selective reflection transmission layer of the second light emitting unit close to the base substrate.

3. The display substrate according to claim 2, wherein the number of the second light emitting unit is two, the two said second light emitting units are sequentially superposed between the first light emitting unit and the base substrate, and optical characteristics of the second selective reflection transmission layers of the two said second light emitting units are different.

4. The display substrate according to claim 3, wherein the organic light emitting layers of light emitting units among the first light emitting unit and the two said second light emitting units are configured to emit light with different color, and the organic light emitting layer of each light emitting unit is configured to emit light with one color.

5. The display substrate according to claim 4, wherein the reflective layer has reflectivity greater than 60% for light emitted from the organic light emitting layer of each light emitting unit among the first light emitting unit and the two said second light emitting units;

the selective reflection transmission layer of any one light emitting unit among the first light emitting unit and the two said second light emitting units has reflectivity greater than 60% for light emitted from the organic light emitting layer of the any one light emitting unit, and has transmittivity greater than 60% for light emitted from the organic light emitting layer of other light emitting units.

6. The display substrate according to claim 3, wherein the first light emitting unit includes any one of a red light unit, a green light unit and a blue light unit; each of the two said second light emitting units includes any one of a red light unit, a green light unit, and a blue light unit.

7. The display substrate according to claim 6, wherein the first light emitting unit being a red light unit, and the two said second light emitting units being a green light unit and a blue light unit, respectively.

8. The display substrate according to claim 7, wherein the material forming the organic light emitting layer of the red light unit comprises: rhodamine dye, 4-Dicyanomethylene-2-methyl-6-(4-dioctylaminostyryl)-4H-pyran or 2-[2-(1-Methylethyl)-6-[2-(2,3,6,7-tetrahydro-1,1,7,7-tetramethyl-1H,5H-benzo[ij]quinolizin-9-yl)ethenyl]-4H-pyran-4-ylidene]propanedinitrile;

the material forming the organic light emitting layer of the green light unit comprises: coumarin fluorescent dye, quinacridone, coronene, or aniline fluorescent dye;

and the material forming the organic light emitting layer of the blue light unit comprises: N-aromatic benzimidazole fluorescent dye, 1,2,4-triazole derivative fluorescent dye, 1,3,4-oxadiazole derivative fluorescence dye or distyrylarylene derivative material.

9. A display device, comprising a display substrate according to claim 1.

10. The display device according to claim 9, further comprising a plurality of second light emitting unit disposed between the first light emitting unit and the base substrate, each second light emitting unit comprising: two second selective reflection transmission layers, as well as an anode layer, a second organic light emitting layer, and a cathode layer sequentially superposed between the two second selective reflection transmission layers, wherein the two second selective reflection transmission layers are capable of reflecting color light emitted from the second organic light emitting layer, so that the color light oscillates between the two second selective reflection transmission layers, and exits the base substrate via the second selective reflection transmission layer of the second light emitting unit close to the base substrate.

11. The display device according to claim 10, wherein the number of the second light emitting units is two, the two said second light emitting units are sequentially superposed between the first light emitting unit and the base substrate, and optical characteristics of the second selective reflection transmission layers of the two said second light emitting units are different.

12. The display device according to claim 11, wherein the organic light emitting layers of light emitting units among the first light emitting unit and the two said second light emitting units are configured to emit light with different color, and the organic light emitting layer of each light emitting unit is configured to emit light with one color.

13. The display device according to claim 12, wherein the reflective layer has reflectivity greater than 60% for light emitted from the organic light emitting layer of each light emitting unit among the first light emitting unit and the two said second light emitting units;

the selective reflection transmission layer of any one light emitting unit among the first light emitting unit and the two said second light emitting units has reflectivity greater than 60% for light emitted from the organic light emitting layer of the any one light emitting unit, and has transmittivity greater than 60% for light emitted from the organic light emitting layer of other light emitting units.

14. The display device according to claim 11, wherein the first light emitting unit includes any one of a red light unit, a green light unit and a blue light unit; each of the two said second light emitting units includes any one of a red light unit, a green light unit, and a blue light unit.

15. The display device according to claim 14, wherein the material forming the organic light emitting layer of the red light unit comprises: rhodamine dye, 4-Dicyanomethylene-2-methyl-6-(4-dioctylaminostyryl)-4H-pyran or 2-[2-(1-Methylethyl)-6-[2-(2,3,6,7-tetrahydro-1,1,7,7-tetramethyl-1H,5H-benzo[ij]quinolizin-9-yl)ethenyl]-4H-pyran-4-ylidene]propanedinitrile;

the material forming the organic light emitting layer of the green light unit comprises: coumarin fluorescent dye, quinacridone, coronene, or aniline fluorescent dye;

and the material forming the organic light emitting layer of the blue light unit comprises: N-aromatic benzimidazole fluorescent dye, 1,2,4-triazole derivative fluorescent dye, 1,3,4-oxadiazole derivative fluorescence dye or distyrylarylene derivative material.

16. A method of fabricating a display substrate, comprising:

forming a first light emitting unit on a base substrate;

the forming a first light emitting unit on a base substrate comprising: sequentially forming, on the base substrate, a first selective reflection transmission layer, an anode layer, a first organic light emitting layer, a cathode layer, and a reflective layer;

wherein the first selective reflection transmission layer and the reflective layer are capable of reflecting color light emitted from the first organic light emitting layer, so that the color light oscillates between the first selective reflection transmission layer and the reflective layer, and exits the base substrate via the first selective reflection transmission layer.

17. The method according to claim 16, wherein, before the forming a first light emitting unit on a base substrate, the method further comprises:

forming a plurality of second light emitting units on the base substrate, respectively, each second light emitting unit comprising: an anode layer, a second organic light emitting layer, a cathode layer, and two second selective reflection transmission layers, wherein, a method for forming each second light emitting unit comprising:

sequentially forming, on the base substrate, one second selective reflection transmission layer of the two second selective reflection transmission layers, the anode layer, the second organic light emitting layer, the cathode layer, and the other second selective reflection transmission layer of the two second selective reflection transmission layers, wherein the second light emitting units are located between the base substrate and the first light emitting unit, and the two second selective reflection transmission layers are capable of reflecting color light emitted from the second organic light emitting layer, so that the color light oscillates between the two second selective reflection transmission layers, and exits the base substrate via the second selective reflection transmission layer of the second light emitting units close to the base substrate.

18. The method according to claim 17, wherein the number of the second light emitting units is at least two, the two said second light emitting units are sequentially superposed between the first light emitting unit and the base substrate, and optical characteristics of the second selective reflection transmission layers of the two said second light emitting units are different.

19. The method according to claim 18, wherein the organic light emitting layers of light emitting units among the first light emitting unit and the two said second light emitting units are configured to emit light with different color, and the organic light emitting layer of each light emitting unit is configured to emit light with one color.

20. The method according to claim 19, wherein the reflective layer has reflectivity greater than 60% for light emitted from the organic light emitting layer of each light emitting unit among the first light emitting unit and the two said second light emitting units;

the selective reflection transmission layer of any one light emitting unit among the first light emitting unit and the two said second light emitting units has reflectivity greater than 60% for light emitted from the organic light emitting layer of the any one light emitting unit, and has transmittivity greater than 60% for light emitted from the organic light emitting layer of other light emitting units.

\* \* \* \* \*